Figure 1:
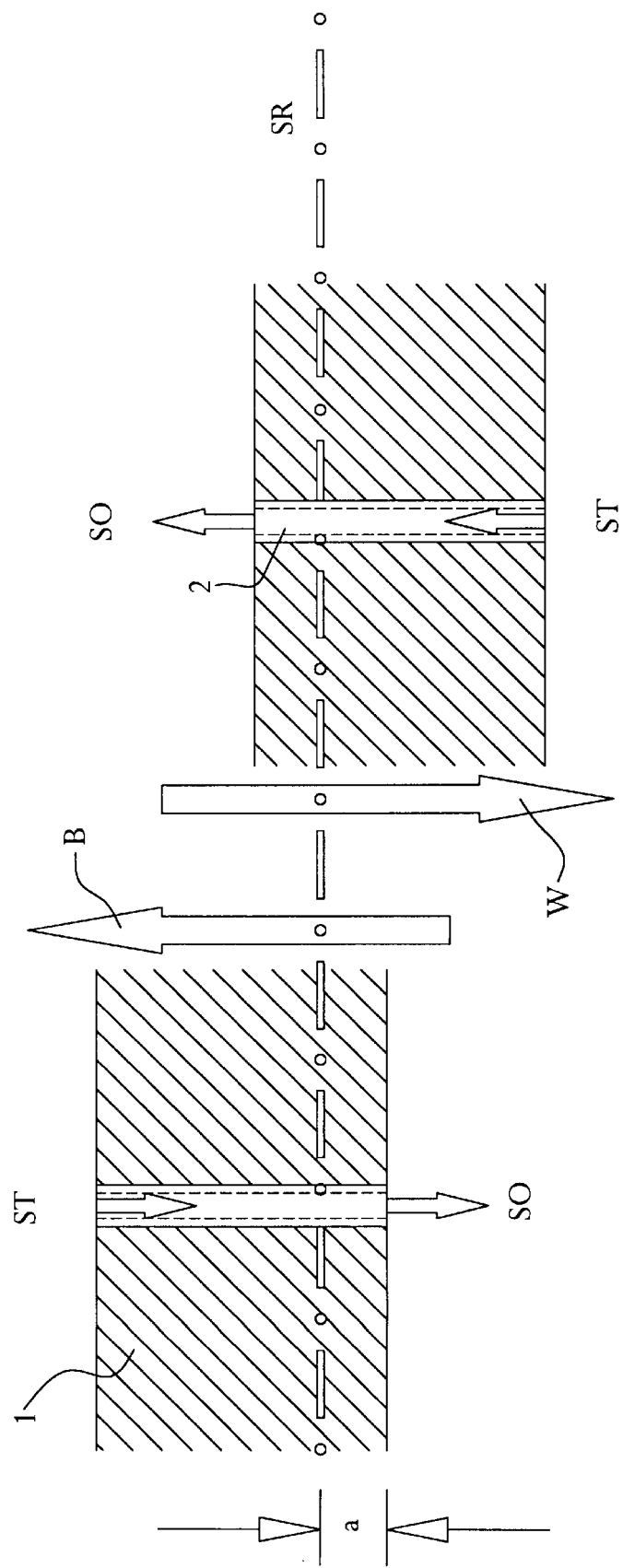

United States Patent [19]
Henig

[11] Patent Number: 6,016,817
[45] Date of Patent: Jan. 25, 2000

[54] METHOD AND DEVICE FOR THE TREATMENT OF PLATE-SHAPED WORKPIECES HAVING SMALL HOLES

[75] Inventor: Hans Henig, Nürnberg, Germany

[73] Assignee: Atotech Deutschland GmbH, Germany

[21] Appl. No.: 08/888,082

[22] PCT Filed: Jan. 5, 1995

[86] PCT No.: PCT/DE95/00029

§ 371 Date: Jul. 3, 1997

§ 102(e) Date: Jul. 3, 1997

[87] PCT Pub. No.: WO96/21341

PCT Pub. Date: Jul. 11, 1996

[51] Int. Cl.[7] ............... B08B 3/12; B08B 6/00; B08B 7/00; B08B 7/02
[52] U.S. Cl. ............ 134/1.2; 134/2; 134/64 R; 134/15; 134/32; 134/902
[58] Field of Search ......... 205/220, 98; 134/1, 134/1.2, 2, 64 R, 15, 32, 902

[56] References Cited

U.S. PATENT DOCUMENTS

| | | | |
|---|---|---|---|
| 3,989,537 | 11/1976 | Sickmeier | 134/1 |
| 4,789,405 | 12/1988 | Blasing et al. | 134/1 |
| 5,030,293 | 7/1991 | Rich et al. | 134/32 |
| 5,593,507 | 1/1997 | Inada et al. | 134/111 |

FOREIGN PATENT DOCUMENTS

| | | |
|---|---|---|
| 2606984 | 2/1976 | Germany . |
| 3011061 | 3/1980 | Germany . |
| 3528575 | 8/1985 | Germany . |
| 3905100 | 2/1989 | Germany . |
| 3916694 | 5/1989 | Germany . |
| 4017380 | 5/1990 | Germany . |

*Primary Examiner*—Kathryn Gorgos
*Assistant Examiner*—Wesley A. Nicolas
*Attorney, Agent, or Firm*—Paul & Paul

[57] ABSTRACT

The treatment of plate-shaped workpieces in particular circuit boards, with small holes by means of liquid or gaseous treatment agents has been founded to be difficult since the fluid flows through the holes only at very low speeds, particularly if the ratio of hole diameter of these holes to hole length is very small, thus preventing adequate movement of fluid through the hole. The invention calls for this problem to be solved by causing the workpiece held in a horizontal position, to carry out a composite motion made up of a first, continuous and/or periodic intermittent sliding movement along a horizontal path and a second movement consisting of vigorous vibration oscillations, the two movements being produced independently of each other. The device used to carry out the method includes means for holding the workpieces in a horizontal position and for sliding them continuously and/or periodically intermittent along a horizontal transport path and means for imparting vigorous pulsating movements to the workpieces, plus means for bringing the workpieces in contact with the treatment agent.

16 Claims, 9 Drawing Sheets

METHOD AND DEVICE FOR THE TREATMENT OF PLATE-SHAPED WORKPIECES HAVING SMALL HOLES

SPECIFICATION

The invention relates to a method and a device for surface treatment of plate-shaped workpieces provided with extremely fine holes, particularly printed circuit board, by means of a liquid or gaseous treatment agent.

BACKGROUND OF THE INVENTION

The surface treatment of plate-shaped workpieces, particularly printed circuit boards, can provide problems when the latter contain holes which are extremely fine. In particular holes in which the ratio of hole diameter to hole length is extremely small, for example 1:10 or less, treatment with the treatment agents can only be carried out with difficulty as these can only be brought into the holes by means of special measures. Such holes are preferably located in multi-layer printed circuit boards, in which a plurality of electrical circuit layers are stacked one above the other and glued together. In this case the holes serve to provide a plurality of conductive connections between the inner and outer layers and if necessary also between the inner layers themselves. In most cases the ends of the printed circuit lines are for this purpose in the form of circular or rectangular plating surfaces. The holes pass through these plating surfaces. For purposes of electrical contacting of the individual circuits with one another, the walls of the holes are metallised. The copper sleeve bearing on the bore wall surfaces thus produced represents the electrical contacting between two or more associated contacting surfaces of the electrical circuits.

Various treatment steps are necessary for metallisation, such for example as cleaning, conditioning, activation, metallising and drying. When the holes are bored, for example, plastic emerges at the resin areas, each only a few micrometers thick, between the metallic surfaces of the electrical circuits in the interior of the printed circuit board; the plastic deposits as a smeared resin film on the bore surfaces of the metal layers to be contacted. In the case of the more usually used FR4 printed circuit boards (laminates with flame-retardant resin and glass fibre mats as reinforcement) the plastic consists of epoxy resins. When such smearing covers roughly 50% of the wall surface of the hole, the conductive connection at the contacting surfaces is already at risk. If a degree of smearing, even in one single plating hole, reaches about 80%, then the entire board should be rejected. When there are a plurality of plating holes for a larger multi-layer printed circuit board and in view of the extremely high manufacturing costs it is therefore clear that this smearing can lead to considerable costs due to waste, while in addition recognition of the smears after drilling is only possible with considerable outlay, and then only in individual holes.

Difficulties in the removal of resin smearing increase as an increasing proportion of small and extremely small holes (for example smaller than 0.4 mm diameter) have to be processed. For example, printed circuit boards are already being produced with a thickness of 7.3 mm and with holes of a diameter of 0.35 mm (ratio of the bore hole diameter to the length roughly 1:21).

Experience has shown that the flow speeds of treatment agent achievable in through plating holes with diameters with less than 0.3 mm and with lengths above 4.5 mm is no longer sufficiently high, so that sufficient exchange of materials at the wall surfaces of the holes is no longer guaranteed. In this case the holes behave almost like capillaries, which in the most favourable case are still wetted by the treatment agents, yet through-flow is only achievable with difficulty. Particularly when the peripheral surfaces of the holes are rough, wetting and through-flow are practically impossible. This is above all the case when operation is with liquid treatment agents, which have a higher viscosity than for example water.

In order to enable wetting and through-flow of such fine holes, it is therefore proposed among other things to pass the workpieces through the treatment plant in a horizontal operational position. In order in this case to bring about forced flooding of the holes, a flow of the liquid treatment agent (splash, spray jet) is directed from a nozzle system against the flat surfaces of the workpieces. During treatment, the workpieces are arranged horizontally and passed in a horizontal transport direction through the plant. Transport from one treatment station to the next is effected via rollers or by travelling carrier clamps, the latter grasping the individual workpieces at the edge or at the edge of two opposite sides in a pincer fashion.

There is for example disclosed in the publication DE 26 06 984 B2 a method for chemical cleaning of plating holes in printed circuit boards with the help of an aggressive acid as a cleaning medium, dissolving epoxy-resin smearing on the hole wall, in which the horizontally guided printed circuit board, after the plating holes have been bored, passes at a constant speed in a closed active chamber over a splash zone, which is formed by a slotted tube located beneath the transport path and perpendicularly to the transport direction, and out of which chemical cleaning agent emerges under pressure, so that the plating holes on the printed circuit board are thereby intensively rinsed. Thereafter the printed circuit board is blown down by a sharp air jet and rinsed.

There is also disclosed in the German Patent DE 30 11 061 C2 a method for intensifying rinsing and cleaning processes for moulded parts provided with perforations, such as printed circuit boards and etched moulded parts, in automatic rinsing and cleaning machines provided with nozzles, in which the moulded parts, treated in active chambers on a transport path, are passed through rinse chambers and are treated from below with rinsing agent, and in which rinsing agent splash zones are additionally used in the rinsing chambers and, in order to generate the rinsing agent splash zones, at least one slotted tube located underneath the transport path is used, from which the rinsing agent emerges under pressure.

In the German Disclosure Document DE 35 28 575 A1 there is described a method of cleaning, activating and/or metallising bore holes in horizontally guided printed circuit boards, in which the printed circuit boards pass at a constant speed over a splash zone, which is formed by a nozzle located beneath the transport path and perpendicular to the transport direction, from which the liquid treatment agent is passed in the form of a standing wave on to the underside of the printed circuit board.

According to the present publications in prior art there is understood by the term "splash" a continuously flowing stream (jet) of the various treatment agents, particularly the liquid but also the gaseous agents, the flow emerging at the highest possible speed from splash nozzles, and impinging on the plate-shaped workpiece (printed circuit board) to be treated. In addition to these methods, methods are also known in which the liquid treatment agents are sprayed or squirted by means of spraying or squirting devices against the workpieces to be treated. During squirting or spraying the treatment agents are intensely permeated by air.

By means of this splashing, spraying or squirting of the liquid treatment agents against the workpiece, the holes located in the workpiece are forcibly flooded, i.e. maximum possible relative movement is produced between the wall surfaces of the holes and the treatment agents flowing through the holes. This relative movement is known to be the most important condition for an effective exchange of materials at the phase limit between solid body (wall surface of the hole) and treatment agent.

The known methods using the splash technique are therefore not suitable for flooding through extremely fine holes. In explanation, a concrete example from operational practice will be described:

In a printed circuit board with an average 64 holes per $cm^2$ surface with a hole diameter of 0.3 mm, the sum of the cross-sectional areas of the holes comes to about 4.5 $mm^2$ per $cm^2$ of printed circuit board surface. The ratio of the average open passage area in the printed circuit board to the closed proportion of the plate surface thus comes to about 4.5%.

The splash flow impinges at high speed perpendicularly on to the flat horizontal surface of the printed circuit board. As the open surface of the printed circuit board in the region of the holes comes to only a small proportion of the overall area, the impinging flow splits into two almost equally large flow components moving apart from one another in opposite directions, and located parallel to the transport direction. These flows run upon and along the plate surface. The small proportion of the cross-sectional openings in the workpiece pierced by holes gives a sufficient indication of the small proportion of the splash jet which flows through the holes, despite forced flooding.

Furthermore, the treatment agent flowing parallel to the surface prevents the formation of flows through the holes, as the penetrating flows are directed perpendicularly to the liquid flowing along the plate surface. The splash jet, contrary to its intended effect, thus exerts an inhibiting effect on the establishment of the flooding of the holes.

In addition the arrangement described in the German Disclosure Document DE 39 16 694 A1 for treatment and/or cleaning of material, particularly printed circuit boards provided with holes, with the aid of a liquid applied in a splash configuration, whereby there is provided on one side of the material to be cleaned or treated a splash zone and on the other side of the material a suction zone, does not lead to the desired successful conclusion. In this case the forced flooding is in fact improved by means for removal by suction of the liquid treatment agent forced through the holes. Yet by means of this arrangement only the resistance which is opposed to the traversing treatment agent by possible rough bore wall surfaces can be overcome.

The method described in the German Patent DE 40 17 380 C1 for rinsing holes in articles to be electroplated, particularly plate-shaped and multi-layer articles such as printed circuit boards, does not remove the problems in through-flow of extremely fine holes. In this method the cleaning or rinsing liquid is passed under pressure through the holes; the speed of the liquid flow passing through the holes is alternatingly increased or reduced.

The splash nozzles described in the publications cited above consist of an elongate rectilinear casing, which is arranged perpendicularly to the transport plane of the printed circuit boards passing through horizontally, as well as parallel thereto, and has a longitudinal slot, from which the emerging splash jet impinges perpendicularly on the flat surface of the plate-shaped workpieces. It can be seen from the above that during the overall treatment time of the workpiece only a fraction of the plate surface and thus only a fraction of the holes located therein are intensely irradiated with the treatment agent. Treatment of the workpiece is effected at irregular points and intervals on the surface, so that, due to the horizontal transport of the workpiece through the plant, treatment of all surface areas is only possible in a gradual manner. This however contains the fact that during a considerable portion of the overall treatment time of the workpiece in the treatment plant, no or practically no flow of treatment agent is generated in the holes.

The German Patent DE 39 05 100 C2 describes a method of chemical or electrolytic surface treatment of plate-shaped workpieces provided with small openings, particularly of large-area printed circuit boards provided with bore holes, for printed circuits, in aqueous solutions, the workpiece executing two separate vibratory movements independent of one another, the first vibratory movement extending at right angles to the surface of the workpiece and the second vibratory movement being effected in roughly the same direction as the first vibratory movement and simultaneously therewith, the frequency of the first vibratory movement being considerably lower than that of the second vibratory movement, which represents an intensely pulsating rapid-sequence vibrational oscillation, the amplitude of the first vibratory movement being considerably greater than that of the second vibratory movement.

This method is suitable only for treating plate-shaped workpieces in installations with baths in which the workpieces are submerged vertically and raised out of said baths again after the treatment, whereupon the workpieces are next transported to the next treatment point. A particular disadvantage in this method is that the vibrational oscillations which are intended to favour the through-flow of the holes of the workpieces can scarcely be transmitted to all the workpieces which are submerged in the bath. When the conventional dip baths are used which in part reach a depth of 1.80 m, the workpieces secured at the lower end of the workpiece holder could only be set in vibration with sufficient amplitude by means of an unreasonably high outlay. In addition, bores in the workpieces can scarcely be flooded, as no flood tubes are provided. Due to the movement of the workpieces, any flood tubes present would have to maintain a relatively large spacing from the workpieces. The workpieces could only with difficulty be introduced from above into the bath container, if flood tubes were located at a small spacing from the workpieces. Therefore the problem underlying the present invention is to avoid the disadvantages known in prior art and to find a method of treating plate-shaped workpieces provided with extremely small holes, particularly of printed circuit board, by means of a liquid or gaseous treatment agent.

By means of the measures according to the invention, the wall surfaces of holes in plate-shaped workpieces, particularly of printed circuit boards are treated by means of liquid or gaseous agents in such a way that in terms of fluid mechanics the highest possible relative movement is produced between the wall surfaces of the holes and the liquid or gaseous treatment agents flowing along these.

SUMMARY OF INVENTION

In the solution according to the invention the workpieces located in a horizontal operational position are subjected to a combined movement, which is made up of two movements independent of one another. For this purpose the printed circuit board is moved in a continuous and/or intermittent sliding movement in a horizontally extending transport path and passed through a treatment plant, and is simultaneously set in motion in a second movement consisting of vigorous vibrational oscillations.

THE PRESENT INVENTION

The frequency of the vibrational oscillations is preferably set at a value above 1 Hertz, and the amplitude of the vibrational movement at a value of less than 10 mm.

The paths of the vibrational movements can either be linear or circular or similar to a circle. In the case where circular vibrational movements or those similar to a circle are used, both possibilities exist, i.e. that the circular movements extend substantially perpendicularly to the workpiece surfaces or substantially parallel thereto. Other angles between the planes of vibration and the workpiece surfaces are however also possible.

The direction of rotation of the circular vibrational movements or those similar to a circle can also alternate periodically, in order to achieve the most uniform possible flooding of the holes.

The devices according to the invention comprise means for grasping the workpieces in a horizontal operational position and for continuous sliding movements or such movements intermittent at periodic intervals at time in a horizontally extending transport path, and further means for imparting to the workpieces vigorous pulsating vibrational oscillatory movements. Means of bringing the workpieces into contact with the treatment agents are also provided.

An unbalanced mass vibration generator is preferably used to produce circular or circle-like vibrational oscillatory movements.

In order to intensify the hrough-flow through the holes and to improve the surface treatment of the workpieces, ultrasound vibrators can in addition be used to generate ultrasound waves in the treatment agent, impinging substantially perpendicularly on the workpiece surfaces. In this way a reinforced turbulent flow is generated within the holes. Ultrasound is conventionally only used when cleaning the peripheral surfaces of the holes.

The ultrasound waves have a frequency above about 10 kilohertz. The sound waves are irradiated substantially perpendicularly on to the printed circuit board surfaces, preferably no screenings being located between the ultrasound vibrators and the surfaces. Although the bore wall surfaces lie parallel to the dispersion velocity of the sound waves, the sound waves also act thereon, as the entirety of the workpieces is set in mechanical vibration by the sound treatment, and thus have a favourable influence on the flow conditions on the bore wall surfaces.

The effect of the method according to the invention is particularly intense if both workpiece surfaces are wetted with the treatment agent, and preferably when the workpiece for treatment is entirely submerged in the treatment agent.

However, good treatment results are achieved when only one of the surfaces is wetted by the treatment agent, for example by splashing, spraying or squirting of the upper or lower side of the horizontally-lying workpiece.

During the movement of the workpieces, substantially continuous flows or spray or squirt jets of the treatment agent may be directed against their surfaces from devices suitable for this purpose. In this way the advantages of the method according to the invention are combined with those of the methods known from prior art, in which the holes in the workpieces are penetrated by treatment agents emerging from splash nozzles.

This procedure can be further improved if the treatment agent is sucked through the holes due to a relative vacuum on one of the workpiece surfaces. Suction chambers, lying opposite one workpiece surface, with preferably rectangular openings of a prismatic shaft, have proven to be suitable devices for generating the partial vacuum.

For most methods, liquid treatment agents come into consideration; these however have a higher viscosity then gaseous treatment agents. Flow through the holes with the liquid treatment agents is thus more difficult.

The method according to the invention also includes treatment of workpieces with gaseous treatment agents, particularly for drying the holes in printed circuit boards by means of heated air. When liquid treatment agents are used, liquid residues can be evaporated from the surfaces of the printed circuit boards and peripheral surfaces of the holes by blowing heated air. In order however to avoid the formation of drying stains, the use of the method according to the invention in drying is particularly advantageous, because the liquid residues are thrown from the surfaces as aerosols by the vibrational oscillatory movements, and are transported away therefrom by the air flow.

According to the Hagen-Poiseuille equation, usable for laminar flows through tubes, the dynamic viscosity of the particularly liquid treatment agents reduces as the temperature of the treatment agent rises. The exchange of material within the holes is thus improved when the treatment agent is used at the highest possible temperature. Due to the temperature increase, the through-flow capacity of treatment agent through the holes and thus the establishment of turbulent flows in the holes and diffusion within the treatment agent are improved. On the other hand however the upper temperature limit depends on the maximum acceptable temperature specific to the treatment stage.

In most cases of methods and devices known from prior art it is proposed to move the treatment agent relative to the practically stationary bore wall surfaces. According to the present invention, on the contrary, the alternative solution is pursued of also moving the printed circuit board and thus the wall surfaces in the holes relative to the treatment agent.

Both variants can however be combined. A series of tests on an operational scale with the devices according to the invention have however shown that, for sufficiently effective exchange of materials at the bore wall surfaces when using the method according to the invention, forced flooding of the holes by means of a splash jet is not necessary in every application.

According to the invention, the workpiece is subjected to vigorous vibrational oscillations. The changes in direction occurring at high frequency generate in the holes unstable flow conditions, particularly due to the known differing speeds of the individual layers of a jet of treatment agent flowing through the hole, so that locally turbulent flows with an intensely turbulent mixture of the individual treatment agent layers is established. The layers of turbulent flow with spatially extremely small turbulence fields have a sleeve shape. In accordance with the velocity profile of such jets, the layers are located concentrically in the hole. The thickness of the turbulently movable layers arising due to the vibrational oscillatory movements comes to the order to about 500 $\mu$m.

The exchange of material necessary for surface treatment (transport of fresh treatment agent to the bore wall surfaces and removal of reaction products from that point) takes place in a relatively thin boundary layer in contact with the bore wall surface, and which adheres thereto by means of molecular adhesion forces and thus moves along with the bore wall surface and thus along with the entire workpiece. The transport of material within this layer is effected exclusively by diffusion.

The layers of the jet of treatment agent contacting the bore wall surface towards the interior of the bore are likewise subjected along with the vibrating workpiece to a movement, yet the movements imparted to the treatment agent by the vibrating workpiece reduce as the spacing from the bore wall surface increases. Due to the internal friction in the treatment agent a velocity drop is established within the boundary layer from the centre of the hole towards the bore wall. The degree of velocity drop depends in particular on the viscosity of the treatment agent: in the case of gaseous treatment agents the velocity drop is steeper than with liquid treatment agents.

FIGS. 1 to 4 illustrate the principle of the method according to the invention, and FIGS. 5 to 9 schematically and by example illustrate the device according to the invention. Shown are:

BRIEF DESCRIPTIONS OF THE DRAWING FIGURES

Figure 2:
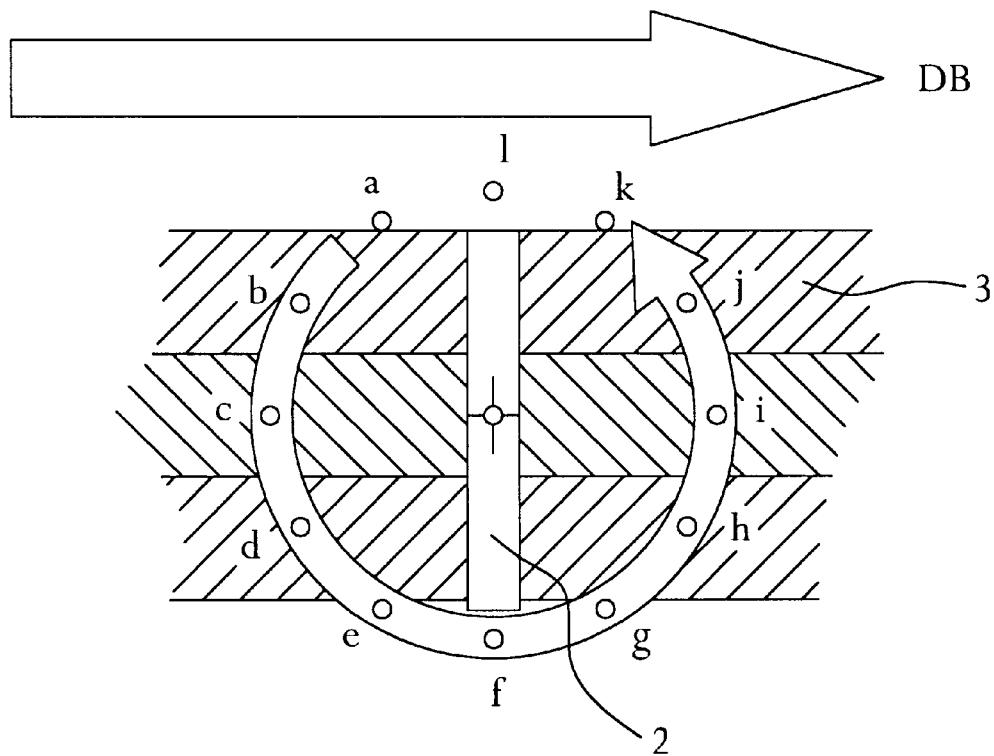
Figure 2:
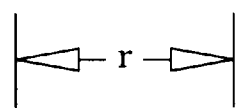
Figure 3A:
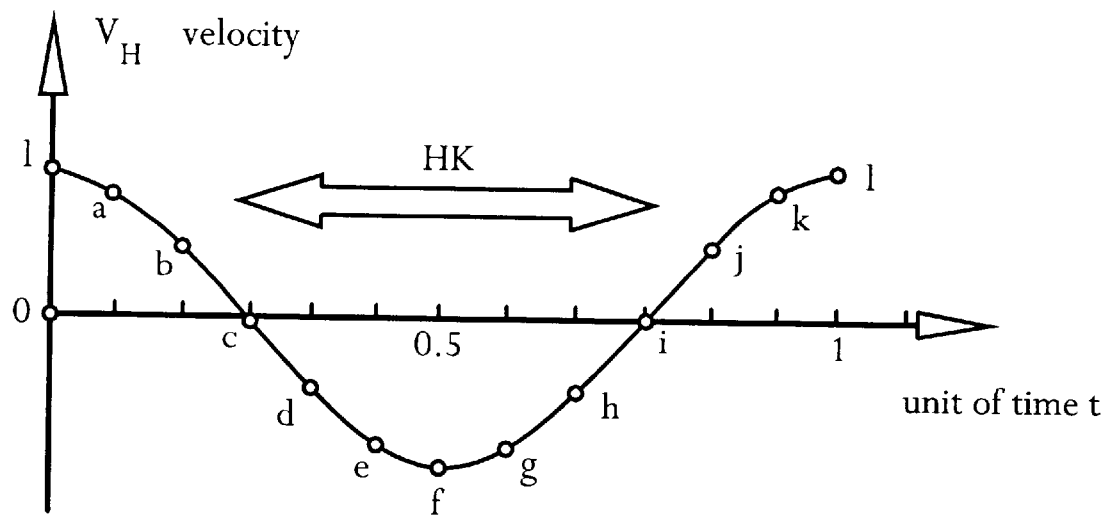
Figure 3B:
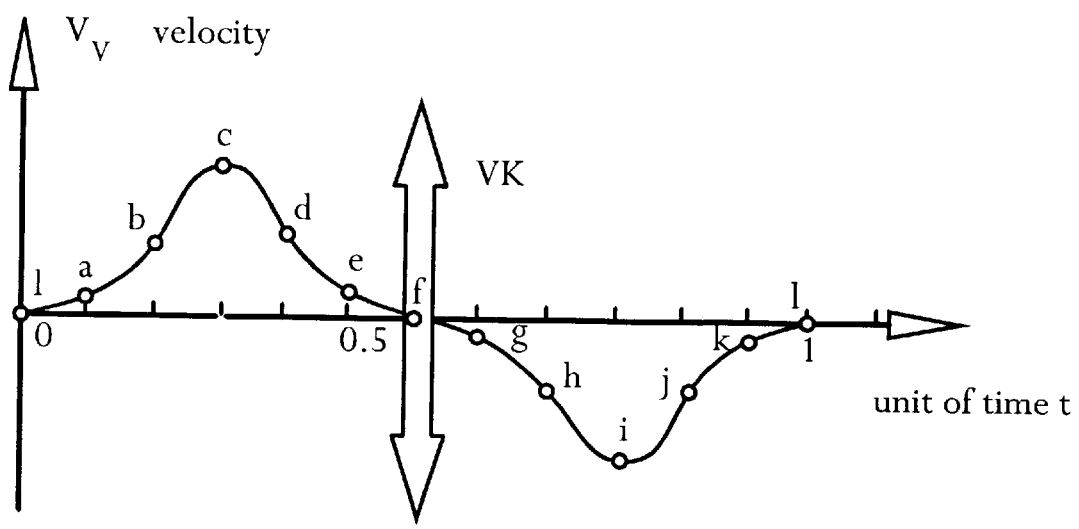
Figure 4:
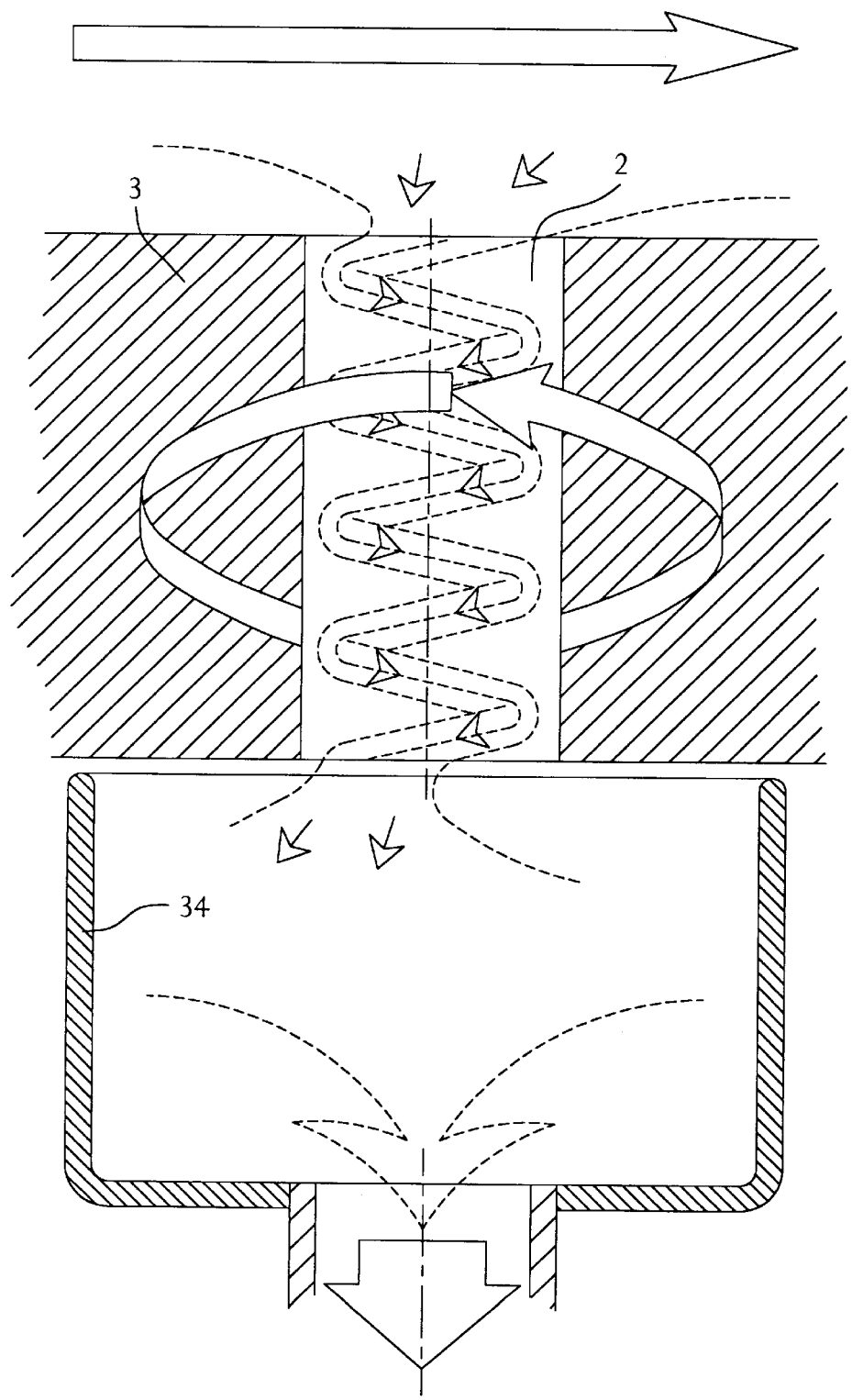

FIG. 1: the effect of a linear vibration;

FIG. 2: the effect of a circular vibrational oscillatory movement perpendicularly to the plane of the board;

FIGS. 3(a) and 3(b): views of the velocity components of the treatment agent in the bore;

FIG. 4: a schematic view of the flow conditions in the hole of a printed circuit board.

Figure 5:
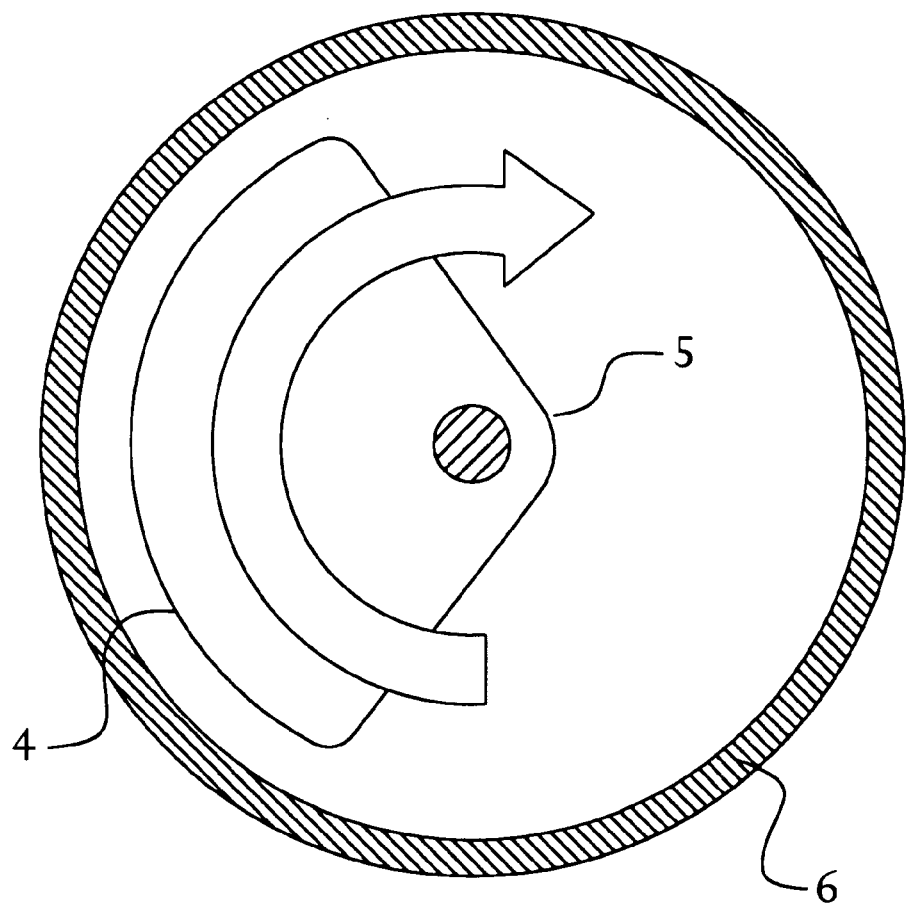
Figure 6:
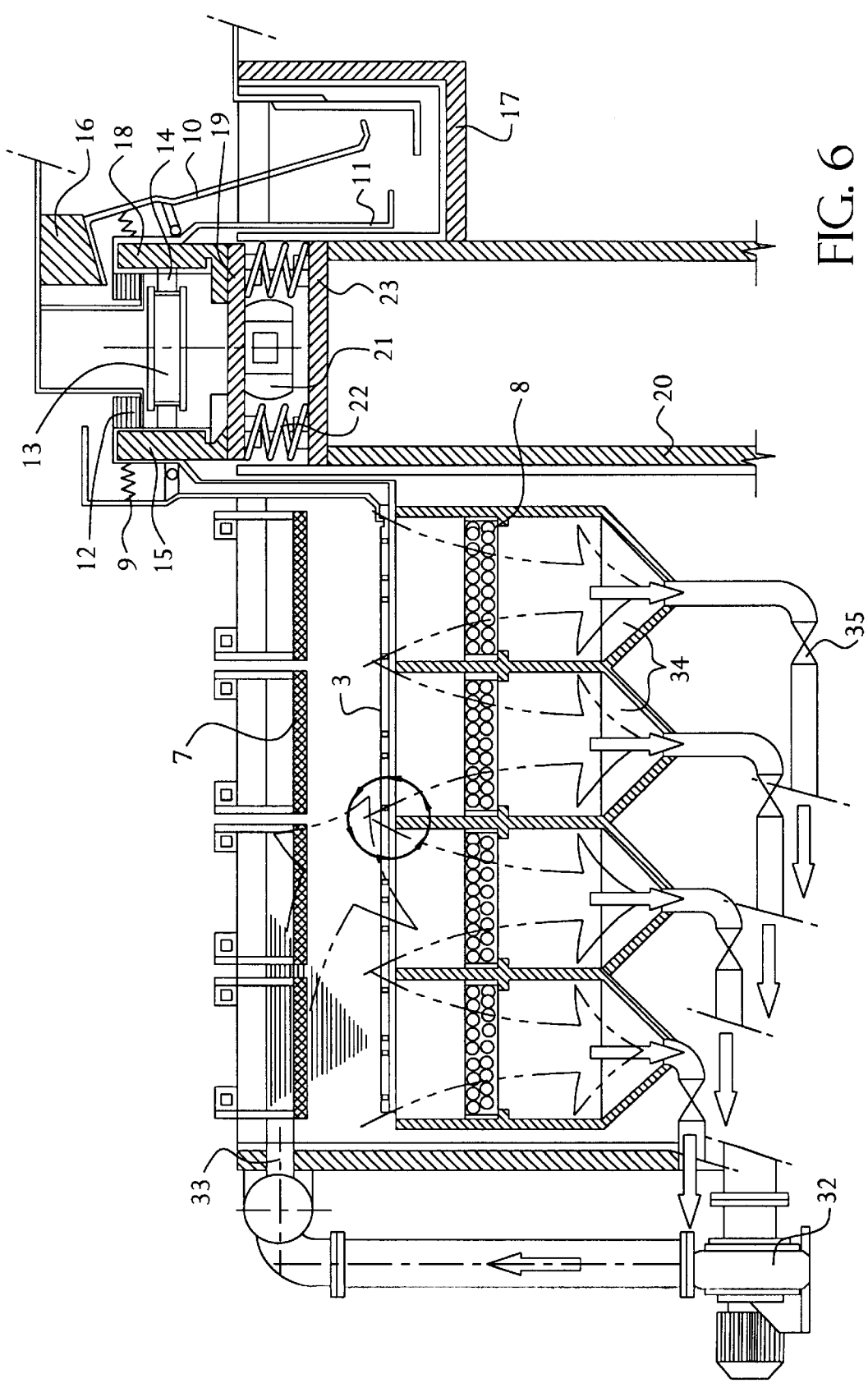
Figure 7:
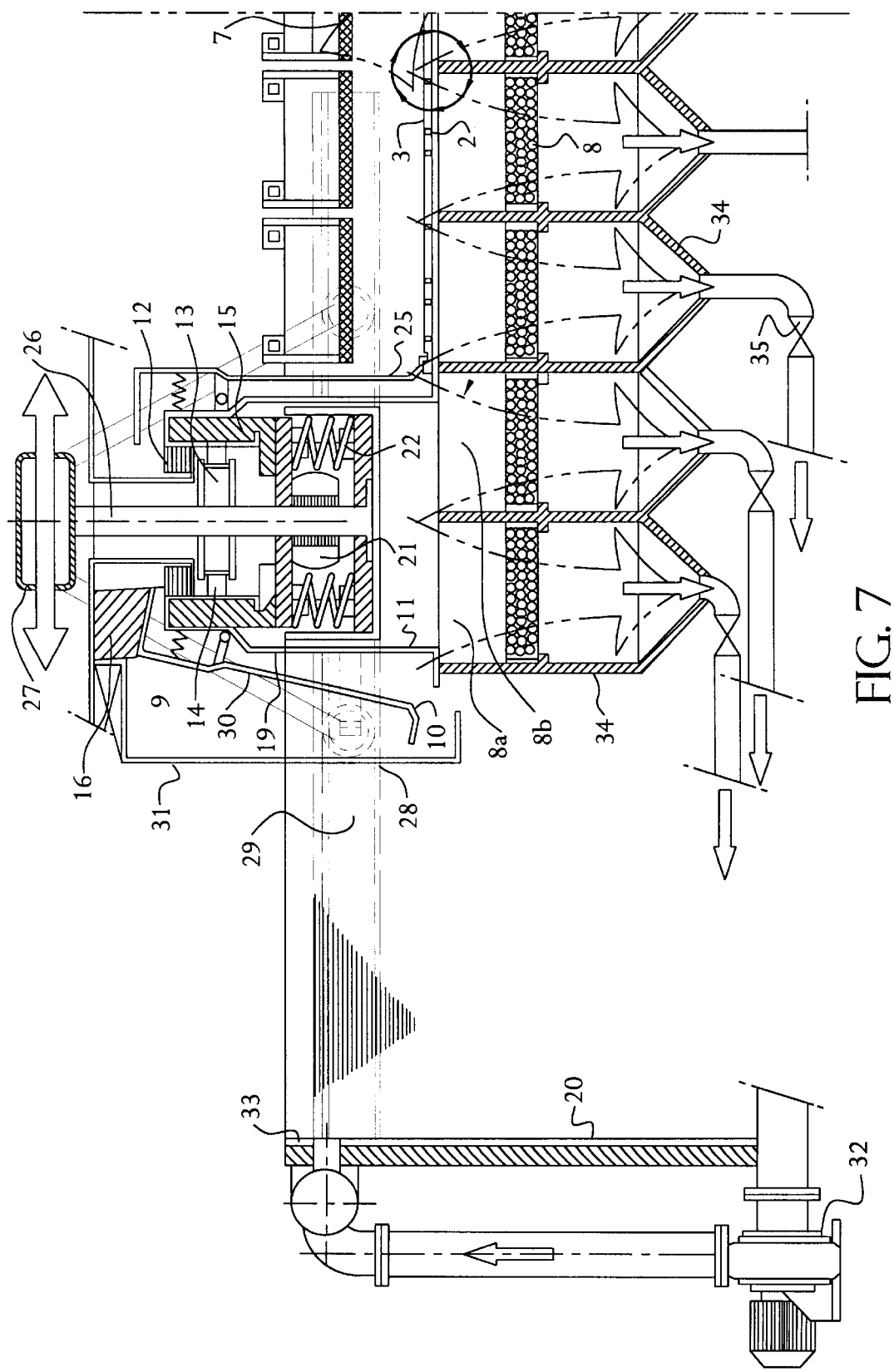
Figure 8:
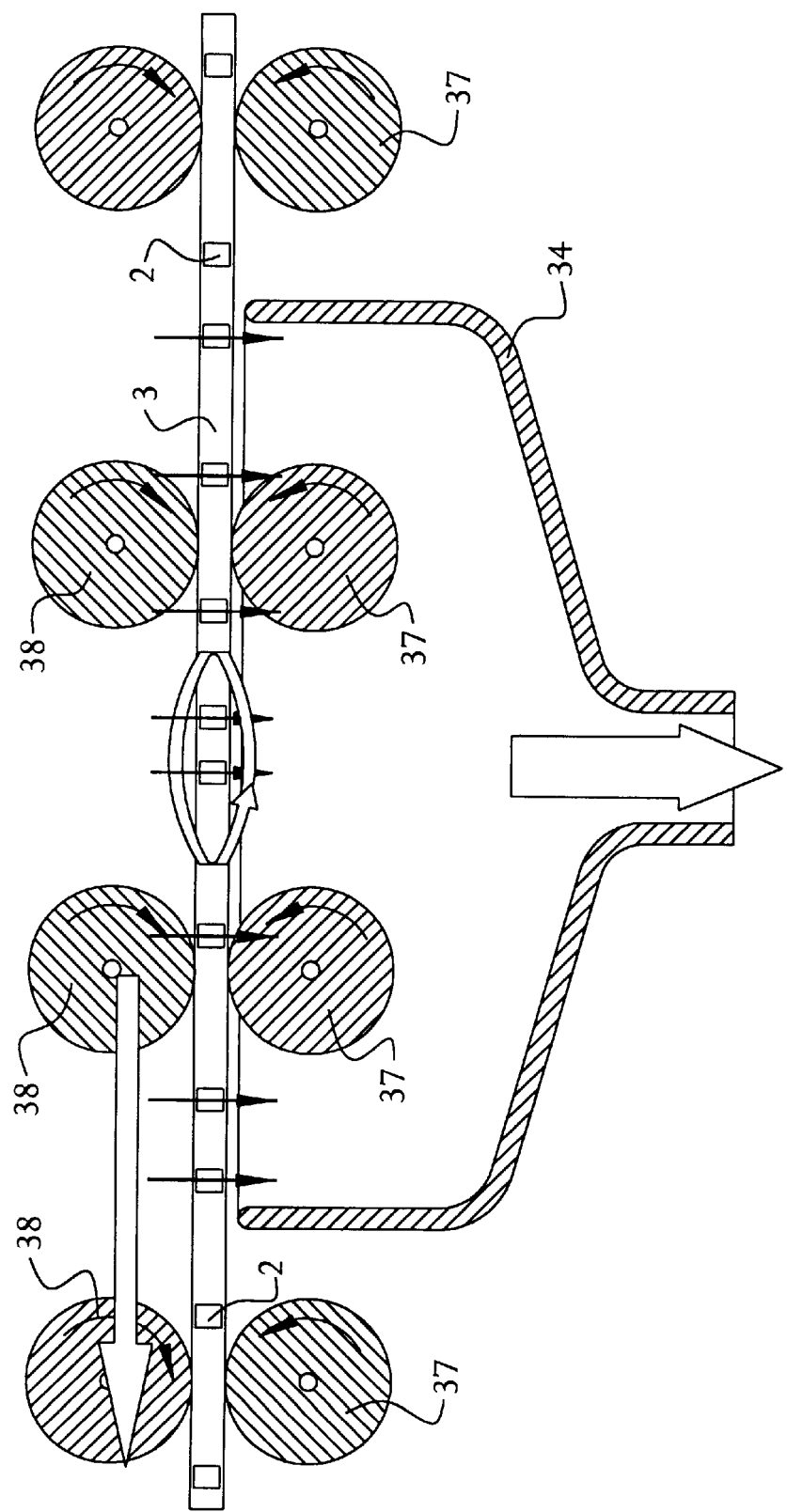
Figure 9:
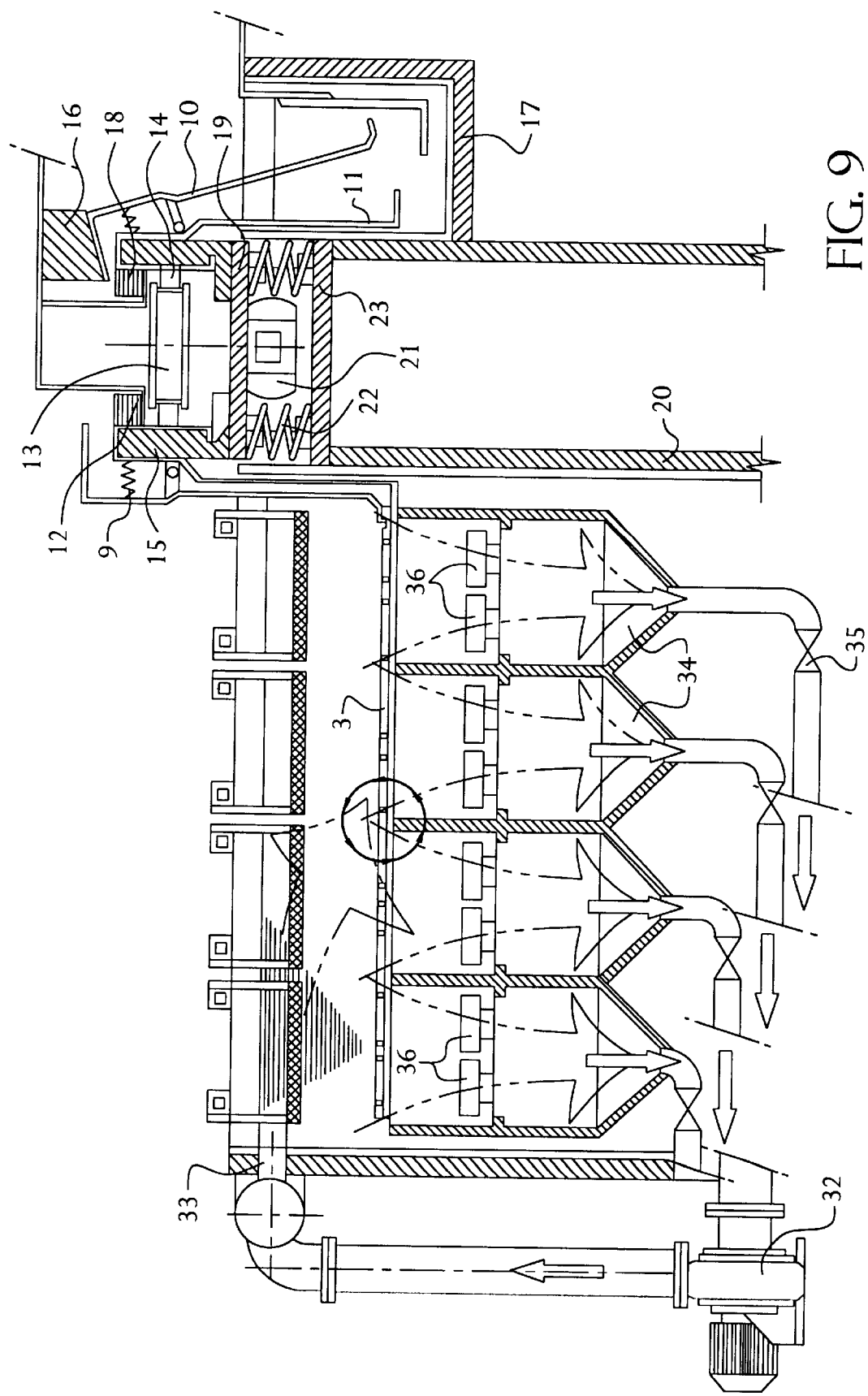

FIG. 5: the principle of operation of an unbalanced mass vibration generator;

FIG. 6: a cross-section through a metallisation system for printed circuit boards;

FIG. 7: a cross-section through a metallisation system with movable vibratory arrangement;

FIG. 8: a detail from a system for chemical treatment of printed circuit boards;

FIG. 9: a cross-section through a metallisation system with ultrasound sources.

DETAILED DESCRIPTIONS OF PREFERRED EMBODIMENTS

FIG. 1 shows a schematic cross-section through a printed circuit board 1 with a hole 2, which executes a vibrational oscillatory movement with linear paths of movement about the static rest point SR. The path of movement (arrows BW) is perpendicular to the surface of the printed circuit board.

As the Figure shows, a pump action is exerted parallel to the axis of the hole by linear vibrational oscillatory movements on the treatment agent located in the holes, where the paths of movement of the vibrational oscillations do not extend in the plane of the workpiece. The measurement gives the momentary deflection of the printed circuit board from the static rest position SR.

The rhythmic to-and-fro movement of the workpieces 1, 3 with hole 2 between the two turning points of the vibrational paths results in power components of the treatment agent acting in the same direction at the hole inlet and outlet (indicated by arrows in the Figure). If the workpiece during the vibrational oscillatory movements moves in one direction there then results at the end of the hole in the direction of movement a hydrodynamic build-up area (excess pressure ST) and at the other end a suction area (partial vacuum SO).

The pressure differentials resulting from this act like a drive force on the liquid column and pump these in the hole in the direction opposite to the movement of the workpiece. If the direction of vibration of the workpiece reverses, the direction of the pump action also changes through 180°.

The vibrational movements can follow a sine curve. Yet, other forms of vibration can be advantageous. The establishment and configuration of the flows of treatment agent in the bores becomes laminar due to gently increasing or decreasing speeds, preferably in the central area of the hole. The laminar flow in the centre of the hole is surrounded by an envelope of turbulent fields. These form the transition to the stationary boundary layers adhering to the bore wall surfaces. Materials are transported within the boundary layers purely by diffusion. The speed of transport in this case depends on the thickness of the boundary layer; thicker layers hinder diffusion. By means of vibrational oscillatory movements, the thickness of the boundary layers is considerably reduced. In this case materials in the treatment agent can also pass more rapidly to the bore wall surfaces.

However, an effective exchange of materials assumes that the materials required for this in the treatment agent located outside the hole are transported into the interior of the hole, are transported rapidly by mixing into the areas with turbulent flow and from that point finally by the boundary layer to the bore wall surfaces. In the reverse case, for example when the bore wall surfaces are being cleaned and impurities must be transported away from these, the transport of materials takes place in the reverse direction. In this case also the flow conditions generated in the holes determine the speed for the set requirements.

It has been possible to show in experiments that even when it was not possible with known methods to flood extremely fine holes with treatment agents, for example due to too high a ratio of the diameter of the holes to their length, generation of local turbulence fields causes an intensive admixture of the treatment agent within the holes and in the areas in the vicinity of the bore wall surfaces, and in this way a sufficient exchange of materials at that point is enabled.

FIG. 2 shows schematically a further preferred embodiment of the method according to the invention. Instead of a linear vibrational oscillatory movement, the workpieces can also be subjected to circular or circle-like vibrational oscillatory movements, the movements either as the Figure shows extending in one plane perpendicular to the workpiece surface, or in a plane located parallel thereto.

In the Figure the configuration of movement of the centre point of the hole is shown in various stages depicted by points a–L of a full rotary vibration. This vibrational movement can be executed both in clockwise and in anti-clockwise direction and can also change its direction, the transport direction DB of the printed circuit board being retained.

The reference number 3 shows the printed circuit board shown schematically in cross-section, the reference number 2 identifies the hole passing through the printed circuit board. The dimension r identifies the amplitude of the circular vibration.

FIGS. 3a and 3b, related to the schematic illustration in FIG. 2, reproduce on a graph the velocity components during a full rotation in the vibrational movement. The reference points a–L in FIGS. 2, 3a and 3b identify the points which the reference point passes during revolution.

The horizontal double arrow HK in FIG. 3a is intended to show the rhythmically increasing and decreasing application pressure applied by the respective velocity component $V_H$ entered over the time t, transversely to the hole axis during revolution, and proportional thereto. This applied pressure acts in the direction of the bore wall surfaces. Due to this chronologically altering velocity component and thus due to the chronologically altering applied pressure, there also arises an increased exchange of material at the bore wall surfaces by reduction of the boundary layer thickness, and also an increase in the turbulence in the turbulent treatment agent layers in the hole adjacent to the boundary layer.

The vertical double arrow VK in FIG. 3b shows the treatment solution being pumped in a pulsed way through the hole along its axis, the chronologically altering vertical velocity component $V_V$ per unit of time t in the axial direction being likewise proportional to the pumping effect already described above. Due to the vibrational oscillatory movement, the throughflow rate in the laminar zone of the hole is increased.

Just as with linear vibrational oscillatory movements, in the case of circular or circle-like vibrational oscillatory movements, frequencies are set above 1 Hertz and circle amplitudes r at a value below 10 mm. According to a further preferred embodiment, the plane of the circular or circle-like vibrational oscillatory movements is parallel to the workpiece surfaces. In this case there results a centrifugal force of the treatment agent located within the intensely circling hole, this centrifugal force engaging on the volume elements of the treatment agent in the hole and likewise pressing them against the bore walls. If the direction of rotation of the circular or circle-like vibrational oscillatory movement lying in the plane of the workpiece surface is periodically alternated, then it is possible further to increase the exchange of materials within the hole.

FIG. 4 shows schematically the flow conditions in a hole in the workpiece during the use of circular or circle-like vibrational oscillatory movements (ellipsoid arrow) in the plane of the workpiece surface, and simultaneously of a sliding forward movement of the workpiece (upper long arrow), the treatment agent, coming from above, being sucked downwards through the hole.

The treatment agent drawn into the hole is forced into a spiral path by the vibrational oscillatory movements. Thus a turbulent admixture of the individual volume elements of the treatment agent is achieved in the hole. The thickness of the stationary boundary layer adhering to the bore wall surfaces is reduced, so that diffusion of materials from and thereto is intensified.

The turbulent movement enables a practically unhindered passage of the treatment agent through the whole.

The method of operation of the method is shown with reference to an example:

The borehole has a diameter of 0.3 mm. The workpiece, a printed circuit board, is subjected to a circular vibrational oscillatory movement with a frequency of f=24 Hertz and an amplitude of 0.3 mm. The bore wall surfaces reach a velocity of $$v = f \times 2\pi r = 22.6 \text{ mm/sec.}$$

The exchange of materials through diffusion takes place in the boundary layer rotating at the same speed, which abuts on the bore wall surfaces. The layers of treatment agent adjacent to the boundary layer are likewise subjected to a rotating movement, yet at a lower speed. In this way a velocity drop is established in the hole.

For comparison, the through-flow velocity of the liquid treatment agent splashed on to the surfaces of the printed circuit board without vibrational oscillatory movements of the printed circuit boards is calculated:

If there is located beneath the printed circuit board according to the devices known from prior art a splash nozzle, from which the liquid treatment agent escapes for example at a hydrostatic pressure of 250 Pa, it arises from the Hagen-Poiseuille equation that the treatment agent requires a flow time through the hole of 4.8 seconds, when the hole diameter is 0.3 mm and the hole length 5 mm, and the liquid treatment agent has a viscosity like water. From this an average speed of the treatment agent in the hole of about 1 mm/sec can be calculated. This value lies clearly below the previously calculated value of about 22 mm/sec.

As the previous calculations did not take account of the fact that the bore wall surfaces are generally not smooth but rough, so that for flow through the hole a free cross-section of less than $(0.3 \text{ mm})^2$ is available, the value during treatment without vibrational oscillatory movements could be even less.

The speed of flow through the hole is a measure of the transport of materials in treatment of the bore wall surfaces. It arises without doubt therefrom that a treatment of workpieces without vibrational oscillatory movements is not sufficient to guarantee effective treatment even of the finest holes. Contrary to this, by means of the method according to the invention, with vibrational oscillatory movements a sufficiently high flow speed can be achieved in the hole, the thickness of the extremely thick boundary layer formed by rough bore wall surfaces, in which the transport of material only proceeds very slowly, being reduced by the forced turbulent flows.

It follows from this that an extremely good exchange of material is enabled not only in a radial direction in the hole, but also an improved exchange in the axial direction.

While the workpieces are subjected to vibrational oscillatory movements, they are continuously and/or intermittently set in a sliding horizontally moving transport path and in a horizontal operational position and in this way pass through the treatment plant. This combination has the advantage that on the one hand the workpieces can be grasped in a simple way in terms of apparatus, so that transmission of the vibrational oscillatory movements to the printed circuit boards is likewise effected simply without substantial losses. Disadvantages that occur for example due to the vertical arrangement of printed circuit boards in previous dip bath systems, in which the printed circuit boards hanging at the lower end of the material carrier can scarcely be set in motion by the excitement of the vibrational oscillations, do not occur in the method according to the invention. Further, it is possible in combination of the movements to pass the workpieces slowly over devices or beneath devices from which the treatment agents emerge in a sharp jet or splash, being thus forced through the holes and in this way reinforcing the vibrational oscillatory movements bringing about flow through the holes.

Furthermore, suction devices can also be provided in a simple way which likewise reinforce the flow through the holes. Further advantages of such systems, through which the workpieces are passed in a sliding manner, reside in the fact that only small quantities of treatment agents need be used, so that the outlay for disposal of used treatment agent is less than in previous dip systems, and the systems can be encapsulated in a simple manner, so that any emission of aerosols and gases are avoided, and finally simple interlinking of the individual treatment modules is possible.

Preferred embodiments of the device according to the invention are shown in the following FIGS. 5 to 9, which show:

FIG. 5 shows the principle of operation of an unbalanced mass vibration generator by means of which the circular or circle-like vibrational oscillatory movements according to the invention can be produced.

In the vibrator, a rotor 4 is set on the shaft 5 of an electric motor 6. The unbalanced forces generated by the eccentric rotor are transferred mechanically directly or indirectly as vibrational oscillations to the printed circuit boards 1, 3. The printed circuit boards move in circular flat paths at a constant angular velocity. The amplitude of the vibrational oscillations can be regulated in an infinitely variable manner, the unbalanced forces being set. Normally vibrational frequencies of a magnitude of 24 hertz are used. In this way treatments with liquid treatment agents for cleaning, activation and metallisation of the bore wall surfaces and printed circuit boards are reliably carried out even with ratios of the hole diameter to its length of above 1:15.

FIG. 6 shows a cross-section through a system for electrolytic metallisation, for example of copper, of printed circuit boards.

The upper anodes 7 located in the liquid treatment agent (metallising solution) are parallel to the circuit boards 3 lying underneath, which are passed along a horizontally-extending transport path perpendicular to the plane of the drawing. Insoluble materials, for example of platinised titanium, are preferably used for the anodes. However, the conventional anodes consisting of the metal to be deposited can also be used. Due to the parallel arrangement, uniformly distributed metallic deposits are generated on the circuit boards. The anodes may be removed in a simple way from the system, so that access is afforded to the lower soluble metal anodes in spherical form (for example copper) contained in perforated titanium cases.

The conductor boards are grasped by clamps and transported in a horizontal operational position in a continuous sliding manner through the metallisation plant. The clamps consist of two brackets 10 and 11 pressed against one another by spring pressure 9. These brackets grasp the circuit boards on at least one of the rectangular sides. In addition to mechanical retention, they fulfil the purpose of transmitting the electrical current for the electrolytic deposition of metal to the printed circuit board. For this purpose the lower bracket 11 slides and rubs along a brush arrangement 12, which is connected to a current source not shown.

A large number of clamps are attached in succession and spaced apart on an endless revolving belt 14 guided by rollers 13. A guide bar comprised of rails 15 extends entirely round the transport system, while an entry bar 16 extends only over that area of the system at which there is no requirement for transport for the circuit board. The run-on surface of the bar 16 is so positioned that, by compressing the spring 9, it disengages the circuit boards from the pair of brackets.

In order again to remove the metal deposited on the ends of the brackets after passing through the metallisation chamber, a further bath container (demetallisation chamber) 17 is provided, which communicates with the metallising solution in the metallisation chamber. The metallising solution is also present in this bath container. A counter-electrode is further provided in the demetallising chamber.

As soon as the pair of brackets, after passing through the metallising chamber, is in the chamber 17, there is passed to it through an electrically separated brush device 18 a current with a polarity which is opposite to that imparted to the brush pair when passing through the metallising chamber. Thus the metal deposited on the pairs of brackets is again electrolytically removed as it passes through the chamber 17.

The guide rollers 13 and rails 15, the endless belt 14, the run-on bar 16, the brush devices 12 and 18, in common with a plurality of pairs of brackets 10, 11 are mechanically securely combined on a base plate 19 as a functional unit. This unit is rigidly mounted on the tub 20 containing the treatment solution.

Beneath the base plate 19 and secured thereto is an unbalanced mass vibration generator 21. Its circular vibrational oscillatory movements are transmitted without resonance to the unit described above. Thus the vibration generator and the unit vibrate in common with an identical frequency. The unit rests on a plurality of vibration dampers, here in the shape of spiral springs 22, which are mounted on a solid pedestal 23 extending along the row of tubs 20. These vibration dampers have the purpose of resiliently absorbing the vibrational oscillatory movements emerging from the unit, so that the pedestal 23 undergoes no vibrational movements. On the other hand it serves to carry the unit mounted thereon.

FIG. 6 shows the clamps (pair of brackets 10 and 11) on the left-hand side of the vibrating transport system in a closed condition gripping the edge of the horizontally located circuit boards, and on the right-hand side of the system (at the demetallising container 17) sliding along, in an open operational condition. In both cases the bottom ends of the pair of brackets dip into the treatment solution. The compressed bracket ends exert a rigid clamping action on the edge of the circuit boards, so that in this way the vibrational oscillatory movements can be transmitted to a large extent without loss to the circuit boards.

The circular vibrational oscillatory movements of the circuit board indicated in the Figure are shown by the small arrows drawn in at the circumference of the circle. The movements are executed about one point in the circuit board. The plane of the circular vibrational movements is perpendicular to the circuit board surface. The vertical vibrational component of the movement causes periodic pumping of the treatment solutions in both directions of the axis of the hole through the said holes.

By means of the horizontal vibrational component, the exchange of material within the holes is increased, turbulent vibrations being generated and diffusion in the boundary layer being increased.

The described arrangement may be directly used on circuit boards whose widths transverse to the transport direction are not too great to allow them to be grasped at one side by an edge. It must always be ensured that the vibrational oscillatory movements emerging from the unit are always uniformly transmitted over the entire circuit board surface.

FIG. 7 shows a cross-section through an arrangement for treating extremely wide circuit boards. Such circuit boards can no longer be grasped on only one side by the clamps with the brackets 10, 11. But also circuit boards with less thickness (foils) can be treated in this arrangement.

In the named cases it is necessary to provide suitable means for transporting the printed circuit boards and for supplying current thereto at two opposed sides of the circuit boards.

FIG. 6 shows the complex for guiding the right-hand edge of the circuit board, while FIG. 7 shows schematically the technical equipment for guiding the opposed (left-hand) side of the same board. In both Figures details of the system are shown in cross-section seen in the direction of transport.

The unit generating the vibrational oscillations is located to be displaceable transversely to the direction of transport (contrary to the stationary arrangement of the unit in FIG. 6). This feature is identified by the double arrow above the unit in FIG. 7.

The constructional elements of the units shown in FIGS. 6 and 7 (guide rollers 13 and rails 15, endless belt 14, run-on bar 16, brush devices 12 and 18, pairs of brackets 10 and 11, base plate 19 and unbalanced mass vibration generator 21) are located symmetrically to one another in a mirror image. Due to the lateral mobility of the unit in FIG. 7 it is possible to use the system also for circuit boards of various widths. By means of this feature, the system may be easily adapted to the altering unforeseen production conditions. Due to the grasp on both sides on the circuit boards by the brackets 10 and 11, the transmission quality of the vibrational oscillatory movements provided by the two units is also improved.

Preferably the frequencies and amplitudes of the vibrational movements of both vibration generators 21 involved and also the sliding velocities of the two transport systems involved are synchronised with one another.

The unit in FIG. 7 is mounted on a slide-like carriage which is substantially made up of a horizontal elongate base plate 25 of a number of perpendicular support pillars 26 anchored therein in a row, and of solid beam 27 connecting these. The beam 27 is the binding member to the two vertical support frames 30 located outwith the bath container 20, rolling on the wheels 28 and guided laterally in the rails 29.

Also mounted on the mobile unit is a counter-electrode, so that the ends of the separated pairs of brackets 10 and 11 can be cleaned electrolytically similarly to the demetallising chamber 17 in FIG. 6.

It may further be seen from FIG. 7 that the width of the circuit board does not cover the two left-hand lower anode cases 8a and 8b.

It is essential for perfect operation that the anodes 8 and the upper insoluble anodes 7 corresponding thereto are separated from the current source as soon as no circuit board lies opposite them, in order to obtain a uniform electrical field for the circuit boards in the treatment solution.

The treatment solution is continually circulated in order to ensure as far as possible a constant chemical composition and constant temperature in the environment of the circuit board. For this purpose the bath solution is permanently circulated by means of pump 32. The large arrows in broken lines and the small black arrows in continuous lines show the direction and the path of the resultant liquid circuit. The solution, coming from the pump 32 flows through a number of inlet nozzles 33 located in a row into the treatment solution in the tub 20 and thus adopts a direction towards the space above the circuit board. The nozzles 33 are levelled with the bath surface.

In a preferred embodiment of the invention, a number of suction chambers 34 are provided close beneath the horizontally located surfaces of the circuit boards. In this way a partial vacuum is generated at the lower ends of the holes 2, so that the treatment solution flowing to the upper ends of the holes is forced to flow downwards through these. The suction effect reinforces the exchange of material at the bore wall surfaces generated by the vibrational oscillatory movements according to the invention.

The chemical and electrolytic treatment of the circuit boards is intended to proceed as uniformly as possible and simultaneously at all points of their surfaces and in all the holes. For this purpose a plurality of suction chambers are provided, acting independently of one another, whose partial vacuum is controlled by magnetic valves 35.

The suction chambers preferably have a prismatic three-dimensional shape, whose upper rectangular side surfaces are aligned as apertures parallel to the circuit boards sliding directly thereabove. Each suction chamber is connected by pressure-controlled magnet valves with their own line to the conveyor pump 32.

In the case of a chemical surface treatment in which no electrical current is required, for example during cleaning of circuit boards, the mutually-opposed rolls or rollers 37, 38, shown schematically in FIG. 8, are preferably used for transporting the circuit boards 1,3. The horizontally disposed rolls/rollers are mounted vertical to the transport direction and in a row above and in a second row beneath the transport path. The lower row, as transport rolls 37, takes over the task of conveying the circuit boards from one treatment station of the system to the next. In the upper row, the free-wheeling pressure rolls 38 are provided. The rolls 38 press the circuit boards without play against the lower row of transport rolls 37.

In a particularly preferred embodiment of the invention, the vibrational oscillatory movements extend in a horizontal plane, i.e. in the plane of the circuit boards. In this case the volume elements of the treatment solution are thrown in the hole against the bore wall surfaces, so that diffusion and convection in the treatment solution are increased considerably within the hole. The circular vibrational movement is shown by the ellipsoid arrow in the Figure.

The horizontal arrow shows the transport direction of the circuit boards.

In this embodiment also there is shown a suction chamber disposed beneath the circuit board, whose wide aperture lies opposite the lower flat surface at a small spacing and is located parallel thereto. In this case also the partial vacuum formed in the suction chamber generates a flow through the holes 2 in the direction of the arrows shown in the Figure. Contrary to a splash jet, which is capable of only locally reaching a small portion of the board surface rectilinearly along the narrow nozzle slot, the suction chambers can reach the circuit board totally during the entire period of time of transport through the treatment station of the system.

FIG. 9 shows a further system in cross-section, the treatment effect of the treatment agent being increased by the use of ultrasonic vibrators 36 and by means of the vibrations generated by the ultrasound waves in the holes. The further details shown in this view correspond to those device elements shown in FIG. 6.

In a further preferred embodiment, the treatment agent is applied by means of splash or spray nozzles to the circuit boards. A splash nozzle consists of an elongate rectilinear casing, which is disposed vertical to the transport direction of the horizontally passing circuit boards and parallel to their plane, or inclined to these. The nozzle has one or more longitudinal slots, from which the emerging splash jet of the treatment agent impinges substantially vertically on the circuit board surfaces. The splash nozzle can be disposed beneath or above, a plurality of splash nozzles may also, at least offset to one another, be disposed on both sides of the circuit boards. A combination of splash nozzles with suction chambers lying opposite these has proved particularly favourable.

I claim:

1. Method of treating plate-shaped workpieces provided with extremely fine holes by means of liquid or gaseous treatment agents, in which to the workpiece located in a horizontal operational position is imparted a combined movement, which is made up of
    a first continuous and/or periodically intermittent sliding movement in a horizontally extending transport path, and
    a second movement consisting of vigorous vibrational oscillations,
both movements being simultaneous with and independent of one another during any said first movement.

2. Method according to claim 1, characterised in that the frequency of the vibrational oscillations is set at a value higher than 1 Hertz.

3. Method according to one of claim 1 or 2, characterised in that the amplitude of the vibrational oscillations is set to a value less than 10 mm.

4. Method according to one of claims 1 or 2, characterised in that the path of the vibrational oscillatory movement is substantially circular and extends in a plane which stands substantially vertical to a surface of the workpiece.

5. Method according to one of claims 1 to 2, characterised in that the path of the vibrational oscillatory movement is substantially circular and extends in a plane substantially parallel to a surface of the workpiece.

6. Method according to one of claims 1 or 2, characterised in that the direction of rotation of the vibrational oscillatory movement changes periodically.

7. Method according to one of claims 1 or 2, characterised in that the workpieces are treated by ultrasonic waves which impinge substantially perpendicularly on the surfaces of the workpiece.

8. Method according to one of claims 1 or 2, characterised in that the workpiece is totally submerged in the treatment agent.

9. Method according to one of claims 1 or 2, characterised in that substantially continuous flows or jets of a liquid treatment agent are directed against the surface of the workpiece and are passed through the holes in the workpiece.

10. Method according to one of claims 1 or 2, characterised in that the treatment agent is sucked through the holes in the workpiece by generation of a partial vacuum on one of the workpiece surfaces.

11. Method according to one of claims 1 or 2, characterised in that heated air is used as a treatment agent for drying the bore walls and the surfaces of the workpiece.

12. Device for treating plate-shaped workpieces provided with extremely fine holes by means of liquid or gaseous treatment agents, comprising means (10,11,37,38) for grasping the workpieces (1,3) in a horizontal operational position and for continuous and/or periodic intermittent sliding movements in a horizontally extending transport path, and means (21) for imparting vigorous pulsating vibrational oscillatory movements to the workpieces, both movements being simultaneous with and independent from one another during any said first movement, as well as means for bringing the workpieces into contact with the treatment agent.

13. Device according to claim 12, characterised by an unbalanced mass vibration generator (21) for producing substantially circular vibrational oscillatory movements of the workpieces (1,3).

14. Device according to one of claims 12 or 13, characterised by ultrasonic vibrators (36) for producing ultrasonic waves in the treatment agent impinging substantially perpendicularly on the surfaces of the workpieces (1,3).

15. Device according to one of claims 12 to 13, characterised by means for producing a continuous flow or a jet of a liquid treatment agent directed on the workpiece surface.

16. Device according to one of claims 12 to 13, characterised by means for sucking the treatment agent through the holes (2) in the workpiece (1,3), comprising one or a plurality of such chambers (34) with apertures lying at a small distance opposite one surface of the workpiece.

* * * * *